United States Patent [19]

McKenzie

[11] 4,435,029

[45] Mar. 6, 1984

[54] SLIDE LOCK HANDLE

[75] Inventor: Robert W. McKenzie, Lewisville, Tex.

[73] Assignee: Rockwell International Corporation, El Segundo, Calif.

[21] Appl. No.: 280,036

[22] Filed: Jul. 6, 1981

[51] Int. Cl.³ .............................................. A47B 88/00
[52] U.S. Cl. ..................................... 312/320; 312/333
[58] Field of Search ..................... 312/107.5, 222, 320, 312/333; 220/315

[56] References Cited

U.S. PATENT DOCUMENTS 1,885,186  11/1932  Defoy ............................. 312/333 X
3,538,724  11/1970  Davenbaugh .................. 312/333 X
4,002,386  1/1977  McKenzie ........................... 312/320

Primary Examiner—William E. Lyddane
Assistant Examiner—Joseph Falk
Attorney, Agent, or Firm—Michael E. Taken; V. Lawrence Sewell; Howard R. Greenberg

[57] ABSTRACT

A locking handle is provided for mounting a circuit card module to a card cage or rack. The module is released from the cage by pulling the handle to flex and bow the latter to a release position disengaging the cage to allow removal of the module. Upon re-insertion, the handle is pushed flat against the front edge of the module by the operator such that the operator need not push against the raw circuit card module edge. After insertion, the handle is translated downwardly to a locking position engaging the cage to prevent removal of the module.

7 Claims, 5 Drawing Figures

SLIDE LOCK HANDLE

TECHNICAL FIELD

The invention relates to locking handles for mounting circuit card modules to a card cage.

BACKGROUND AND SUMMARY

The present invention provides an improvement to the locking handle shown in my U.S. Pat. No. 4,002,386, incorporated herein by reference. This previous handle has end portions lockably engaging a card cage rack to prevent removal of a circuit card module to which the handle is secured. The circuit card module is removed by pulling the handle to flex the latter and release its end portions from engagement with the card cage.

Upon reinsertion of the circuit card module, the handle had to remain in a bowed position. This forced the operator to push on the raw edge of the circuit card module in order to apply insertion force. This has become particularly objectionable to an operator installing many units, and can be painful.

One attempt to obviate user engagement of a raw circuit card module edge involved the use of a non-locking handle, e.g., FIG. 7 of said patent. Electrical connectors were added at the back of the card cage to engage all connector pins on the circuit card, whether or not in use, to secure the modules. This alternative was not entirely satisfactory because heavier modules tended to work loose. Furthermore, positive locking was needed on critical modules.

In another proposal, a non-locking handle was used to avoid user engagement of a raw circuit card module edge, and a spring retainer clip was added to afford locking. The clip was wedged between the module and the card cage retaining lip, and this clip required flexing in order to release the unit. While this did solve the problem, such solution was too costly because of the part cost of the clip and the labor to incorporate it.

The present invention evolved from efforts to eliminate the additional cost of the clip, and to obtain a simpler solution to the problem of user engagement of a raw circuit card module edge. An additional objective was that the new handle adapt to existing circuit card modules and their mounting hole pattern.

The present invention meets these and other objectives in solving the above noted problem, and does so in a particularly simple and efficient manner.

DETAILED DESCRIPTION

Figure 1:
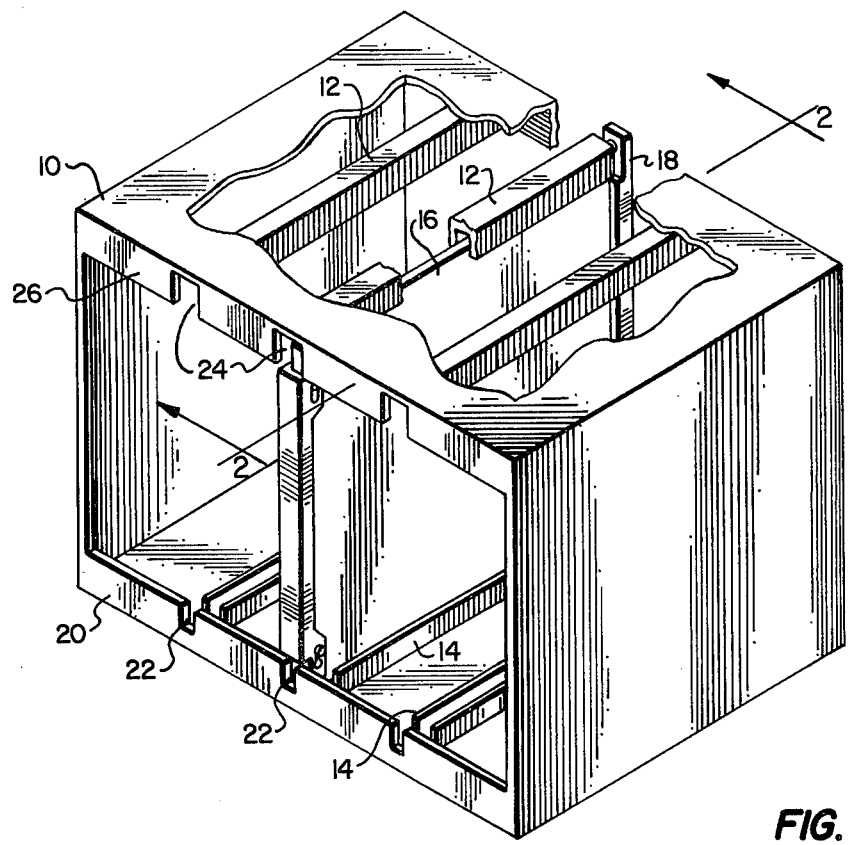
FIG. 1 is an isometric illustration of a card cage with a circuit card module mounted threin having a locking handle constructed in accordance with the invention.

Referring to FIG. 1, a card cage or rack 10 has a plurality of upper tracks 12 directly above respective lower tracks 14, each pair receiving a circuit card module such as 16 inserted into the card cage. A plurality of electrical connectors such as 18 are at the back of the card cage for electrical interconnection with the modules. The front of the card cage has a lower lip 20 with a plurality of slots 22 below respective wider slots 24 in upper lip 26. These slots are in registry with the tracks for guiding and aligning circuit card modules 16 during insertion.

Figure 2:
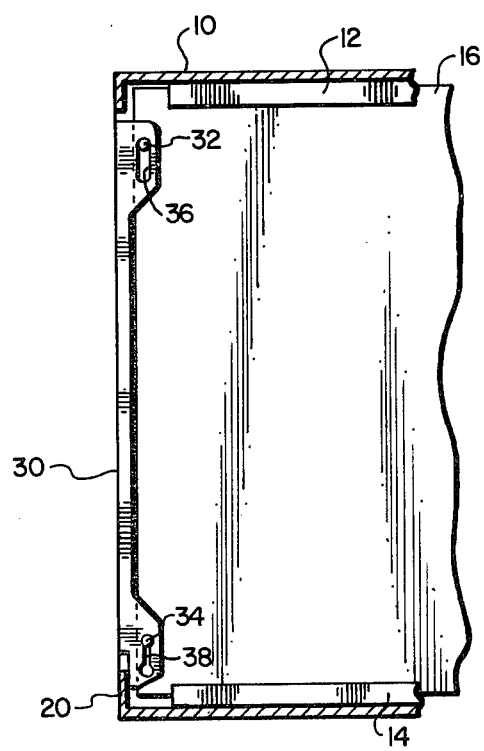
FIG. 2 is a partial sectional view taken along line 2—2 of FIG. 1.
Figure 3:
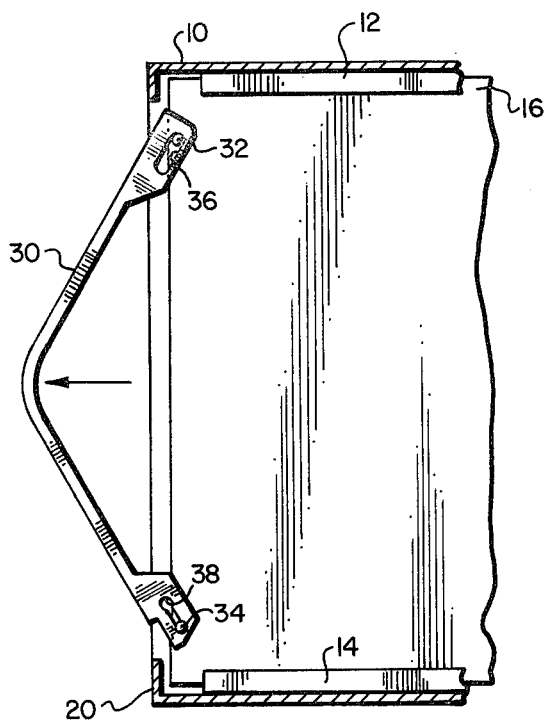
FIG. 3 is a view like FIG. 2 but shows bowing of the handle to a release position upon removal pulling force applied to the handle.

FIG. 2 shows circuit card module 16 retained in card cage 10 by locking handle 30 in its locked position. Locking handle 30 is an elongated flexible member secured at its distal ends to the front facing edge of module 16 for pivotal movement to a flexed bowed position, FIG. 3, unlocking handle 30 from cage 10 at lip 20 to permit removal of module 16. Upon reinsertion of module 16, FIG. 4, pushing force is applied by the operator against handle 30, obviating user engagement of the raw circuit card module front edge. After reinsertion, FIG. 5, handle 30 is translated to a locking position, FIG. 2, engaging cage 10 at lip 20 to prevent removal of module 16.

Figure 5:
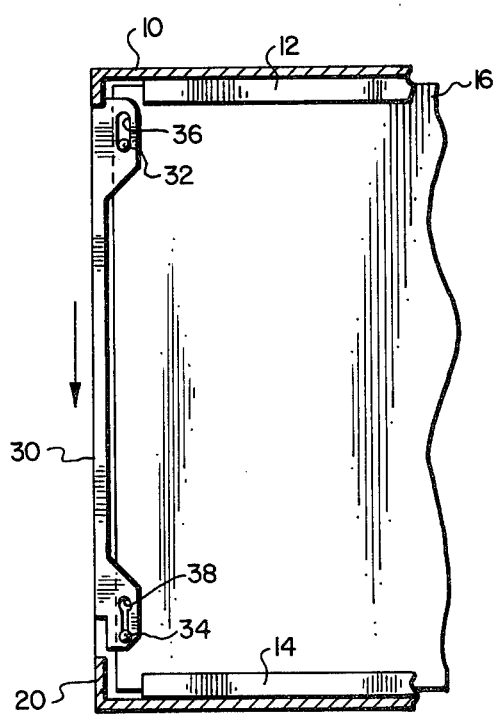
FIG. 5 is a view like FIG. 2 and shows the handle in its upward unlocked position after re-insertion of the module, the handle being translatable downwardly to the locking position shown in FIG. 2.

Handle 30 is secured to module 16 by pins extending through elongated slots providing pivotal movement about the pins and translational movement along the slots. In contradistinction to the handle shown in my said U.S. Pat. No. 4,002,386, in the present invention the pins are oriented relatively in the slots to permit translational movement of the handle in unbowed condition between locking and non-locking positions. As seen in FIGS. 2 and 5, handle 30 translates up and down in unbowed condition.

Figure 4:
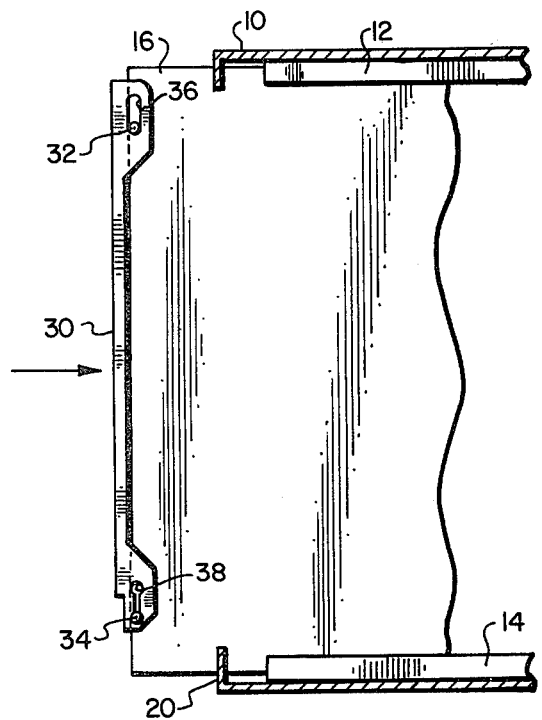
FIG. 4 is a view like FIG. 2 and shows the module partially removed from the card cage, with the handle flat against the front raw circuit card module edge in response to re-insertion pushing force applied to the handle.

Handle 30 may be secured to module 16 as shown in FIGS. 4 or 5 of my said U.S. Pat. No. 4,002,386. Pins 32 and 34 are attached to module 16, and elongated slots 36 and 38 are in the distal ends of handle 30. In one embodiment, each pin is at the bottom of its slot when the handle is in unbowed, unlocked position, FIG. 5; and each pin is at the top of its slot when handle 30 is in unbowed, locked position, FIG. 2. In this embodiment, bottom pin 34 is at the bottom of slot 38 and top pin 32 is at the top of slot 36 when handle 30 is in bowed, unlocked position, FIG. 3. One of the slots, for example slot 38, has a detent configuration, such as the barbell shape shown and described in my said U.S. Pat. No. 4,002,386, engaging its pin for frictionally retaining handle 30 in the up or down unbowed position. The other slot 36 has a nonrestricting configuration permitting unrestrained translational movement of pin 32 therethrough. In one alternative, slot 36 may be further elongated upwardly such that pin 32 is in the middle of slot 36 when handle 30 is in its downward, unbowed, locked position, FIG. 2.

As in my said U.S. Pat. No. 4,002,386, bottom slots 22, FIG. 1, are only wide enough to allow insertion of the thickness of the circuit card module 16 therethrough, not handle 30. Upper slots 24 are wider than lower slots 22 and permit free passage of handle 30 therethrough. An alternative is the elimination of upper lip 26. It is thus seen that one end, e.g. the lower end, of handle 30 engages card cage 10 (at lip 20) in the locked position, FIG. 2, and is pivoted and translated to an unlocked position, FIG. 3, in response to removal pulling force applied to handle 30, flexing and bowing the latter. Handle 30 is pivoted back to an unbowed position, FIG. 4, flat against the front facing raw edge of module 16 in response to insertion pushing force applied against handle 30. The lower end of the handle remains in the unlocked position, due to the detent configuration of slot 38. After insertion, FIG. 5, handle 30 is translated downwardly parallel to the front facing edge of module 16 to the locked position with said one end thereof engaging cage 10, FIG. 2.

It is recognized that various modifications are possible within the scope of the appended claims.

We claim:

1. A locking handle for mounting a circuit card module to a card cage, comprising an elongated flexible member secured at its distal ends to the front facing edge of said module, with one end of said handle engaging said cage in a locked position and being pivoted and translated to an unlocked position in response to removal pulling force applied to said handle, flexing and bowing the latter, and wherein said handle is pivoted back to an unbowed position flat against said module edge in response to insertion pushing force applied against said handle, said member including means for causing said one end of said handle to remain in said unlocked position during insertion, and wherein after insertion said handle is translated to said locked position with one end thereof engaging said cage, said handle laying flat against said front edge of said module during said insertion such tht insertion force is applied against said handle, obviating user engagement of a raw circuit card module edge.

2. The invention according to claim 1 wherein the direction of said locking translational movement of said handle is parallel to said front facing edge of said module.

3. The invention according to claim 1 wherein said handle is secured to said module by pins extending through elongated slots providing pivotal movement about said pins and translational movement along said slots, said pins being relatively oriented in said slots to permit translational movement of said handle in unbowed condition between locking and non-locking positions.

4. The invention according to claim 3 wherein said handle translates up and down in said unbowed condition.

5. The invention according to claim 4 wherein:
said pins are attached to said module and said slots are in said distal ends of said handle;
at leasat one pin being at the bottom of its slot when said handle is in unbowed, unlocked position;
at least one pin being at the top of its slot when said handle is in unbowed, locked position;
the bottom pin being at the bottom of its slot and the top pin being at the top of its slot when said handle is in bowed, unlocked position.

6. The invention according to claim 4 wherein one of said slots has a detent configuration engaging its pin for frictionally retaining said handle in the up or down unbowed position.

7. The invention according to claim 6 wherein the other of said slots has a non-restricting configuration permitting unrestrained translational movement of its pin therethrough.

* * * * *